(12) United States Patent
Jiang et al.

(10) Patent No.: US 12,730,383 B2
(45) Date of Patent: Sep. 8, 2026

(54) QUASI-DYNAMIC IN SITU ELLIPSOMETRY METHOD AND SYSTEM FOR MEASURING PHOTORESIST EXPOSURE PROCESS

(71) Applicant: HUAZHONG UNIVERSITY OF SCIENCE AND TECHNOLOGY, Hubei (CN)

(72) Inventors: Hao Jiang, Hubei (CN); Lei Li, Hubei (CN); Jiamin Liu, Hubei (CN); Shiyuan Liu, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 507 days.

(21) Appl. No.: 18/488,047

(22) Filed: Oct. 17, 2023

(65) Prior Publication Data

US 2024/0402614 A1 Dec. 5, 2024

(30) Foreign Application Priority Data

May 29, 2023 (CN) ......................... 202310619606.2

(51) Int. Cl.
*G03F 7/00* (2006.01)
*G01N 21/21* (2006.01)

(52) U.S. Cl.
CPC ....... *G03F 7/70608* (2013.01); *G01N 21/211* (2013.01); *G03F 7/706839* (2023.05); *G03F 7/706851* (2023.05); *G01N 2201/12* (2013.01)

(58) Field of Classification Search
CPC . G01B 11/00; G01B 11/0625; G01B 11/0641; G01B 11/06; G01B 11/30; G01J 3/447; G01N 21/211; G01N 2201/12; G01N 2021/213; G01N 21/21; G01N 21/8422; G01N 21/9501; G01N 21/31; G01N 21/41;

(Continued)

(56) References Cited

PUBLICATIONS

10. Wurm, Matthias & Grunewald, Tobias & Teichert, Sven & Bodermann, Bernd & Reck, Johanna & Richter, Uwe. (2020). Some aspects on the uncertainty calculation in Mueller ellipsometry. Optics Express. 28. 8108-8131. 10.1364/OE.381244 (Year: 2020).*

(Continued)

*Primary Examiner* — Catherine T. Rastovski
*Assistant Examiner* — Eric Sebastian Von Wald
(74) *Attorney, Agent, or Firm* — JCIPRNET

(57) ABSTRACT

The disclosure provides a quasi-dynamic in situ ellipsometry method and system for measuring a photoresist exposure process. The method includes: obtaining a measured Muller matrix of a photoresist at different exposure times by a Muller matrix ellipsometer; building a forward optical model of the photoresist and obtaining a theoretical Mueller matrix; inverting and fitting the measured Mueller matrix and the theoretical Mueller matrix and obtaining ellipsometric parameters of the photoresist at different times, an average extinction coefficient, and a film thickness; building a relational model of a Dill parameter of the photoresist and optical properties of the photoresist, and an exposure model of the photoresist; building a relational model of a theoretical extinction coefficient and the extinction coefficient and obtaining theoretical extinction coefficients of the photoresist after different exposure times; and inverting and fitting the average extinction coefficient and the theoretical extinction coefficient and obtaining the Dill parameter.

13 Claims, 4 Drawing Sheets

(58) Field of Classification Search
CPC ........... G03F 7/70608; G03F 7/706851; G03F 7/706839; G03F 7/70616; G03F 7/705; G03F 7/70508; G03F 7/2002; G06F 17/16; G06F 17/18; G06F 30/20; G06F 2111/10
See application file for complete search history.

(56) References Cited

PUBLICATIONS

11. Zhang, Song & Jiamin, Liu & Jiang, Hao & Liu, Shiyuan. (2019). Characterization of beam splitter using Mueller matrix ellipsometry. 48. 10.1117/12.2511510 (Year: 2019).*
12. Liu, Shiyuan. (2011). Computational lithography and computational metrology for nanomanufacturing. NEMS 2011—6th IEEE International Conference on Nano/Micro Engineered and Molecular Systems. 1093-1099. 10.1109/NEMS.2011.6017547 (Year: 2011).*

* cited by examiner

QUASI-DYNAMIC IN SITU ELLIPSOMETRY METHOD AND SYSTEM FOR MEASURING PHOTORESIST EXPOSURE PROCESS

CROSS-REFERENCE TO RELATED APPLICATIONS

This application claims the priority benefit of China application no. 202310619606.2 filed on May 29, 2023. The entirety of the above-mentioned patent application is hereby incorporated by reference herein and made a part of this specification.

BACKGROUND

Technical Field

The disclosure belongs to the related technical field of optical film measurement, and in particular, relates to a quasi-dynamic in situ ellipsometry method and system for measuring a photoresist exposure process.

Description of Related Art

The photoresist exposure process is an important part of the photolithography process, and this process significantly affects the final quality of a chip. The measurement and research on the property change of a photoresist in the exposure process has important reference significance in terms of improving the photolithography process and improving the performance of the photoresist. A photochemical reaction occurs when the photoresist is exposed to ultraviolet light. The geometric shape and optical properties of the photoresist itself may also change with the progress of the photochemical reaction. Specific process parameters are improved most of the time based on experiences, so sufficient theoretical support is absent. However, in the conventional transmission measurement method, the change of the geometric shape of the photoresist during the exposure process is ignored. The obtained results are relatively single, and it is difficult to perfectly characterize the photoresist exposure process.

Ellipsometry is an effective method for thin film measurements, and due to the advantages of non-destructive, non-contact, and fast measurement speed, ellipsometry is often used in the characterization of various metal and non-metal thin film materials. When the photoresist is prepared as a thin film, the geometric parameters and optical properties of the photoresist can be measured by ellipsometry. Compared to the conventional transmission measurement method, the photoresist does not need to be spin-coated on glass with similar refractive index in ellipsometry, so ellipsometry is more suitable for practical application scenarios. Further, a Mueller matrix ellipsometer is able to obtain a large amount of sample optical information in one measurement, from which geometric and optical parameters such as thickness, roughness, refractive index, and extinction coefficient of the sample may be extracted. The abundance of measurement data facilitates the characterization of the geometric and optical properties of the photoresist.

Ellipsometry is a model-based measurement technique, and the measurement accuracy of ellipsometry depends largely on the accuracy of the model. However, the optical properties of the photoresist will change nonlinearly with the exposure time during the exposure process. In the previous measurement experiments, only the photoresist is measured statically, and the exposure process of the photoresist is not measured dynamically. Therefore, it is difficult to accurately characterize the photoresist exposure process due to the lack of a dynamic model of the exposure process of the photoresist. Therefore, there is an urgent need to provide an accurate and complete method for measuring the photoresist exposure process.

SUMMARY

In response to the above defects or the needs for improvement in the related art, the disclosure provides a quasi-dynamic in situ ellipsometry method and system for measuring a photoresist exposure process, and through the method, a photoresist is statically measured and an exposure process of the photoresist is quasi-dynamically measured, so that the exposure process of the photoresist is accurately characterized.

To achieve the above, in an aspect of the disclosure, the disclosure provides a quasi-dynamic in situ ellipsometry method for measuring a photoresist exposure process, and the method includes the following steps. In S1, Mueller matrix information of a photoresist before exposure is measured by a Mueller matrix ellipsometer, the photoresist is exposed and measured by the Mueller matrix ellipsometer until Mueller matrix data remains unchanged, and then a measured Mueller matrix of the photoresist is obtained. In S2, the photoresist is treated as a uniform film, a forward optical model is built, and a theoretical Mueller matrix is then obtained. In S3, the measured Mueller matrix and the theoretical Mueller matrix are inverted and fitted, and the ellipsometric parameters, the average extinction coefficient, and the film thickness of the photoresist at different times are obtained. In S4, a relational model of a Dill parameter of the photoresist and optical properties of the photoresist, and an exposure model of the photoresist are built. The optical properties include an extinction coefficient, an exposure light source wavelength, exposure light intensity, and a relative photoactive compound concentration of photoresist, and the Dill parameter includes the bleachable absorbance and the non-bleachable absorbance, and a reaction rate constant. In S5, a relational model of a theoretical extinction coefficient and the average extinction coefficient is built, and theoretical extinction coefficients of the photoresist after different exposure times are obtained. In S6, the average extinction coefficient and the theoretical extinction coefficient are inverted and fitted, and the Dill parameter is obtained.

In a preferred embodiment, the relational model of the Dill parameter of the photoresist and the optical properties of the photoresist in step S4 include:

$$\alpha = AM + B = 4\pi k/\lambda$$

$$\frac{\Delta M}{M} = \exp(-IC\Delta t),$$

where α is an absorption coefficient, M is a relative photoactive compound (PAC) concentration at a specific position in the photoresist, k is an extinction coefficient, λ is an exposure light source wavelength, I is an exposure light intensity at a corresponding position, A is the bleachable absorbance, B is the non-bleachable absorbance, C is the reaction rate constant, ΔM is a change in relative PAC concentration, and ΔT is a change time.

In a preferred embodiment, the exposure model is to divide the photoresist into a stack of T layers of thin films with uniform thickness.

In a preferred embodiment, the relational model of the theoretical extinction coefficient and the extinction coefficient in step S5 is:

$$k_{mod} = \frac{1}{T}\int_0^T k_z dz,$$

where $k_{mod}$ is the theoretical extinction coefficient, $k_z$ is the extinction coefficient, and T is a total thickness of a photoresist film.

In a preferred embodiment, the inverting and fitting the average extinction coefficient and the theoretical extinction coefficient in step S6 is: a deviation function of the average extinction coefficient and the theoretical extinction coefficient is constructed, a Dill parameter initial value and the film thickness are inputted, the Dill parameter is fitted, and the Dill parameter by minimizing the deviation function is obtained.

In a preferred embodiment, the deviation function of the average extinction coefficient and the theoretical extinction coefficient is:

$$\text{Mse\_k} = \left(\sum_t (k_{mod}(t) - k_{ave}(t))^2\right)/Q,$$

where $k_{mod}(t)$ is a theoretical extinction coefficient at time t, $k_{ave}(t)$ is an average extinction coefficient at time t, and Q is a number of sampling points.

In a preferred embodiment, a deviation function of the measured Mueller matrix and the theoretical Mueller matrix is constructed and is solved by minimizing the deviation function.

In a preferred embodiment, the deviation function of the measured Mueller matrix and the theoretical Mueller matrix is:

$$mse = \left(\sum_{\lambda}(M_{mod}(\lambda) - M_{exp}(\lambda))^2\right)/q,$$

where $M_{mod}$ is the theoretical Mueller matrix, $M_{exp}$ is the measured Mueller matrix, $\lambda$ is wavelength, and q is a number of wavelengths $\lambda$.

The disclosure further provides a quasi-dynamic in situ ellipsometry system for measuring a photoresist exposure process, and the system includes a measure module, a first model building module, a calculation module, a second model building module, a third model building module, and a second calculation module. The measure module is configured to measure Mueller matrix information of a photoresist before exposure by a Mueller matrix ellipsometer, expose the photoresist and measure the photoresist by the Mueller matrix ellipsometer until Mueller matrix data remains unchanged, and obtain a measured Mueller matrix of the photoresist. The first model building module is configured to treat the photoresist as a uniform film, build a forward optical model, and obtain a theoretical Mueller matrix. The calculation module is configured to invert and fit the measured Mueller matrix and the theoretical Mueller matrix and obtain ellipsometric parameters, an average extinction coefficient, and a film thickness of the photoresist at different times. The second model building module is configured to build a relational model of a Dill parameter of the photoresist and optical properties of the photoresist, and an exposure model of the photoresist. The optical properties include an extinction coefficient, an exposure light source wavelength, exposure light intensity, and a relative photoactive compound concentration of photoresist, and the Dill parameter includes a bleachable absorbance, a non-bleachable absorbance, and a reaction rate constant. The third model building module is configured to build a relational model of a theoretical extinction coefficient and the extinction coefficient and obtain theoretical extinction coefficients of the photoresist after different exposure times. The second calculation module is configured to invert and fit the average extinction coefficient and the theoretical extinction coefficient and obtain the Dill parameter.

In general, when the above technical solutions conceived by the disclosure are compared to the related art, it can be seen that the quasi-dynamic in situ ellipsometry method and system for measuring a photoresist exposure process provided by the disclosure mainly exhibit the following beneficial effects.

1. In the disclosure, the above method is used to collect the dynamic ellipsometric parameters of the photoresist under different exposure powers. The constructed photoresist forward optical model is used to fit the measured ellipsometric parameters, and the ellipsometric parameters and optical properties of the photoresist at different exposure reaction times are obtained. Next, the exposure model based on the Dill equation is used to fit the dynamic optical property curve to determine the Dill parameter of the photoresist. In this way, the advantages of in situ quasi-dynamic measurement, easy integration in the production line, reaction process monitoring, and rich measurement information are achieved.
2. The forward optical model of the photoresist used to analyze the ellipsometry results is linked to the Dill parameter of the photoresist and the exposure dose. The Dill parameter of the photoresist may be accurately fitted through the ellipsometry analysis results during the exposure process.
3. Compared to the currently-available measurement methods, the above measurement experimental solution and the modeling analysis method conceived by the disclosure are able to accurately and perfectly characterize the dynamic change process of the geometric and optical properties of the photoresist exposure process. Strong data support is provided for the improvement of photoresist performance and further optimization of the photolithography process.

DESCRIPTION OF THE EMBODIMENTS

In order to make the objectives, technical solutions, and advantages of the disclosure clearer and more comprehensible, the disclosure is further described in detail with reference to the drawings and embodiments. It should be understood that the specific embodiments described herein serve to explain the invention merely and are not used to limit the invention. In addition, the technical features involved in the various embodiments of the invention described below can be combined with each other as long as the technical features do not conflict with each other.

Figure 1:
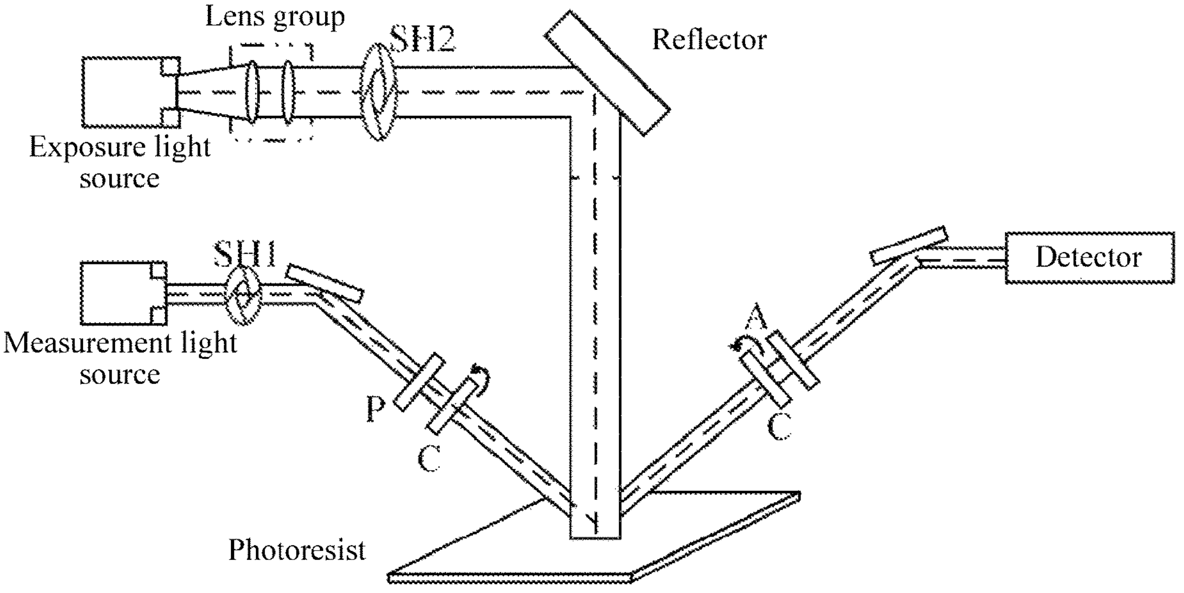
FIG. 1 is a schematic diagram of an experimental device for a photoresist exposure process according to an embodiment of the disclosure.

An experimental device for an exposure process of a photoresist is shown in FIG. 1. An exposure light source of an experimental bench passes through a lens group and a reflector in turn and is vertically incident on the photoresist. A measurement light source passes through the reflector, a polarizer P, and a compensator C in turn, is incident on the photoresist obliquely, reflects off the photoresist, passes through compensator C, an analyzer A, and the reflector, and then enters a detector.

In this embodiment, when the exposure light source used in the measurement experiment is a coherent light source, it is necessary to consider the standing wave effect caused by the interference of reflected light and incident light in a photoresist exposure model. Herein, the light intensity does not decrease monotonically with the incident depth.

Figure 2:
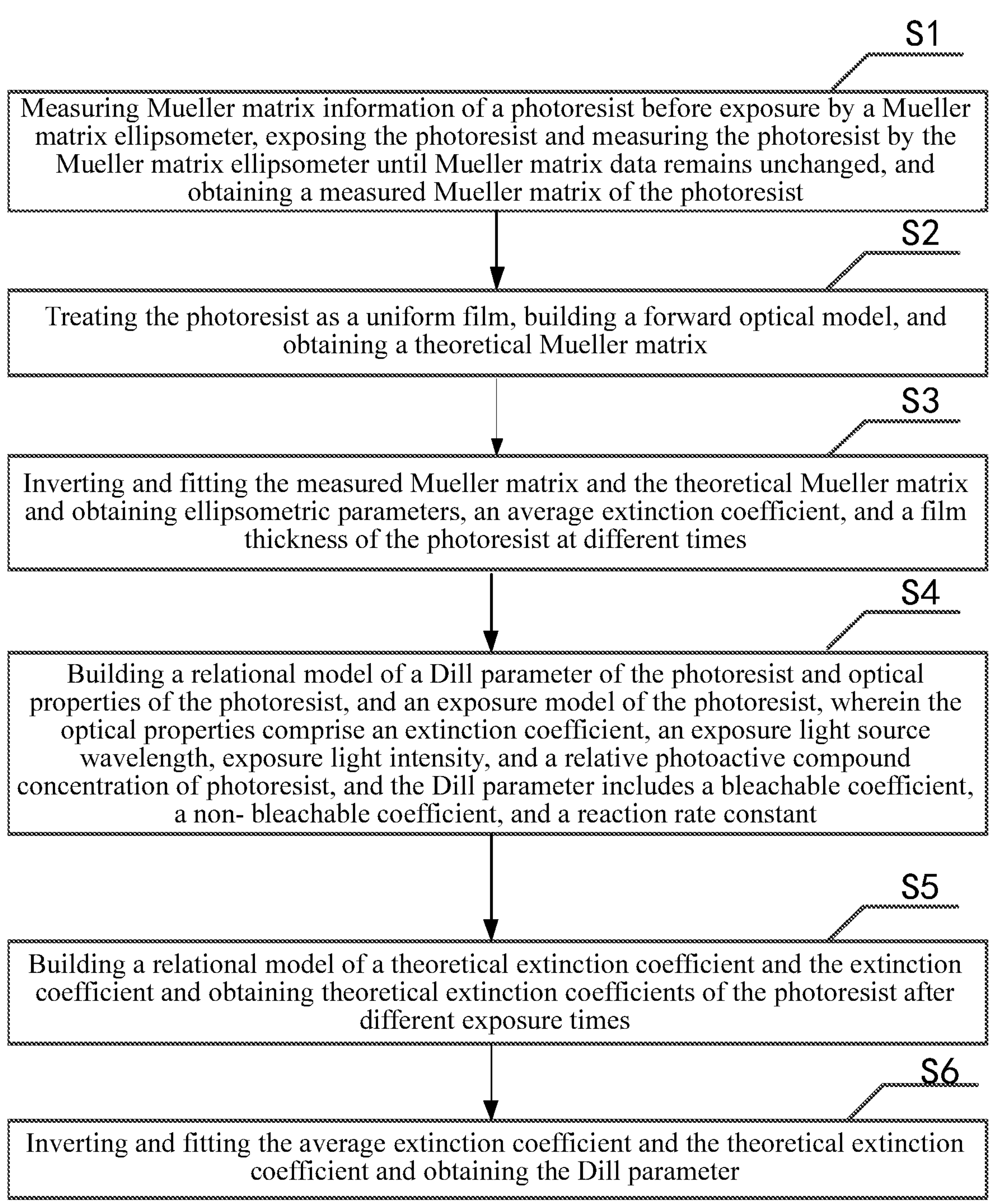
FIG. 2 is a step diagram of a quasi-dynamic in situ ellipsometry method for measuring a photoresist exposure process according to an embodiment of the disclosure.
Figure 3:
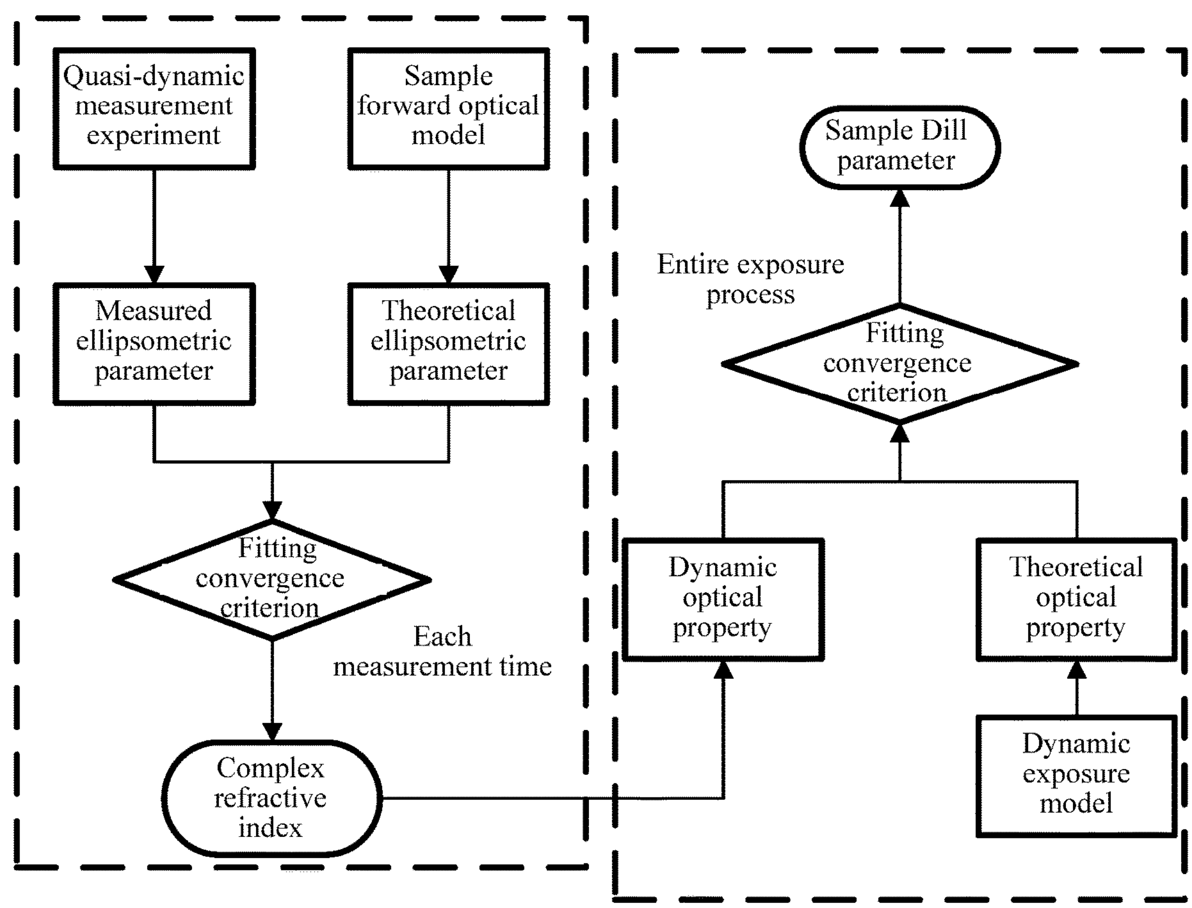
FIG. 3 is a flow chart of the quasi-dynamic in situ ellipsometry method for measuring the photoresist exposure process according to an embodiment of the disclosure.

With reference to FIG. 2 and FIG. 3, the disclosure provides a quasi-dynamic in situ ellipsometry method for measuring a photoresist exposure process, and the method includes the following steps S1 to S6.

In S1, Mueller matrix information of a photoresist before exposure is measured by a Mueller matrix ellipsometer, the photoresist is exposed and the photoresist is measured by the Mueller matrix ellipsometer until Mueller matrix data remains unchanged, and then a measured Mueller matrix of the photoresist is obtained.

To be specific, the Mueller matrix information of a sample of the photoresist before exposure is measured by the Mueller matrix ellipsometer, an exposure optical path is then opened and is closed after irradiating the sample for $\Delta T$ time, and the position of the sample remains unchanged. The Mueller matrix information of the sample of the photoresist is measured again by the Muller matrix ellipsometer, the exposure is repeated, and the measurement process is performed until the measured data no longer changes. The Mueller matrix $M_{exp}$ of the sample measured by the Mueller matrix ellipsometer at a wavelength $\lambda$:

$$M_{exp} = \begin{bmatrix} m_{11} & m_{12} & m_{13} & m_{14} \\ m_{21} & m_{22} & m_{23} & m_{24} \\ m_{31} & m_{32} & m_{33} & m_{34} \\ m_{41} & m_{42} & m_{43} & m_{44} \end{bmatrix} \quad (1)$$

It is preferred to use a broad-spectrum ellipsometer for in situ measurement, and the position of the resist remains unchanged during exposure and measurement. In this way, the influence caused by the uneven thickness at different positions of the photoresist is eliminated, and the measurement accuracy is improved.

The ellipsometer used in this embodiment is a broad-spectrum Muller matrix ellipsometer, and the exposure light source used is an incoherent commercial ultraviolet light source with a waveband of 365 nm. Taking the measurement of the AZ5214E type photoresist film as an example, the photoresist quasi-dynamic measurement experimental method provided by the disclosure is described.

A 365 nm ultraviolet light exposure device based on Kohler illumination is integrated on the spectroscopic ellipsometer, and the photoresist is exposed step by step with lower power. Further, in situ measurement is performed using a broad-spectrum Mueller matrix ellipsometer between exposures until the optical properties of the photoresist no longer changed. The exposure power is changed, and the dynamic ellipsometric parameters of the photoresist under different exposure powers are collected through the above method.

A photoresist sample is prepared by spin coating on a 2-inch wafer, and the thickness of the photoresist is controlled at approximately 2000 nm. The Mueller matrix of the photoresist sample is measured by an ellipsometer at an incident angle of 65° under yellow light or no light environment, and the position of the photoresist on the sample stage is kept unchanged after the data is recorded. The UV light source is turned on, illuminates the photoresist sample for five seconds, and is then turned off. Under the same measurement configuration, the Mueller matrix of the photoresist sample at this time is measured by the ellipsometer, the data is recorded, the exposure-measurement process is repeated until the directly measured Mueller matrix is no longer changed on the ellipsometer.

In S2, the photoresist is treated as a uniform film, a forward optical model is built, and a theoretical Mueller matrix is then obtained.

Figure 4:
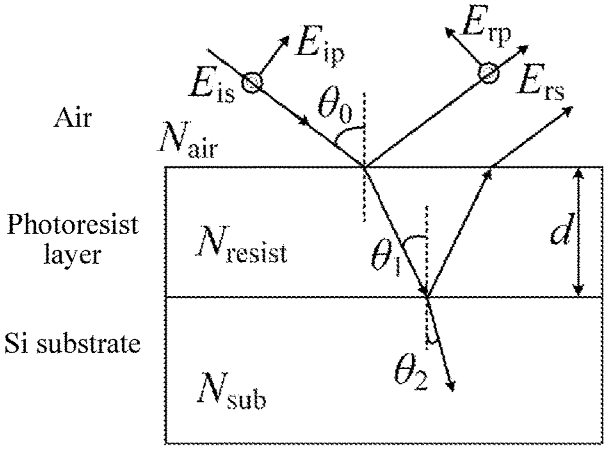
FIG. 4 is a forward optical model of a sample built by treating a photoresist as a uniform film according to an embodiment of the disclosure.

To be specific, the photoresist is initially treated as a uniform film, and the forward optical model of the sample is built (as shown in FIG. 4). The method of building the forward optical model of the uniform thin film sample is a conventional modeling method in the field of ellipsometry, so description thereof is not be repeated herein. For an isotropic uniform film, its theoretical Mueller matrix $M_{mod}$ at the wavelength $\lambda$ is:

$$M_{mod} = \begin{bmatrix} 1 & -\cos 2\psi & 0 & 0 \\ -\cos 2\psi & 1 & 0 & 0 \\ 0 & 0 & \sin 2\psi\cos\Delta & \sin 2\psi\sin\Delta \\ 0 & 0 & \sin 2\psi\sin\Delta & \sin 2\psi\cos\Delta \end{bmatrix}, \quad (2)$$

where $\psi$ and $\Delta$ are an amplitude ratio and a phase difference, respectively. The theoretical Mueller matrix $M_{mod}(\lambda)$ and the measured Mueller matrix of the photoresist are inverted and fitted, and a deviation function of the theoretical Mueller matrix and the measured Muller matrix is built. The fitting is performed by minimizing the deviation function, and the ellipsometric parameters $\psi$ and $\Delta$ of the photoresist sample at different times, an average extinction coefficient $k_{ave}(\lambda)$, and a film thickness d of the photoresist are obtained.

In S3, the measured Mueller matrix and the theoretical Mueller matrix are inverted and fitted, and the ellipsometric parameters, the average extinction coefficient, and the film thickness of the photoresist at different times are obtained.

The measured Mueller matrix and the theoretical Mueller matrix are inverted and fitted through the following. The deviation function of the measured Mueller matrix and the theoretical Mueller matrix is constructed and is solved by minimizing the deviation function.

The deviation function of the measured Mueller matrix and the theoretical Mueller matrix is:

$$mse = \left( \sum_{\lambda} (M_{mod}(\lambda) - M_{exp}(\lambda))^2 \right) / q, \quad (3)$$

where $M_{mod}$ is the theoretical Mueller matrix, $M_{exp}$ is the measured Mueller matrix, $\lambda$ is the wavelength, and q is the number of wavelengths $\lambda$.

For reflective measurements, at the wavelength $\lambda$, the following relationship is provided:

$$\tan\psi \exp(i\Delta) = \frac{r_p}{r_s}, \quad (4)$$

where $r_p$ and $r_s$ represent a total reflection coefficient of p-polarized light and s-polarized light at the incident wavelength $\lambda$, which may be obtained from the forward optical model of the film sample through the Fresnel formula.

$$r_{ij,p} = \frac{n_j\cos\theta_i - n_i\cos\theta_j}{n_j\cos\theta_i + n_i\cos\theta_j}, \; r_{ij,s} = \frac{n_i\cos\theta_i - n_j\cos\theta_j}{n_i\cos\theta_i + n_j\cos\theta_j} \quad (5)$$

$$r_{012} = \frac{r_{01} + r_{12}\exp(-i2\beta)}{1 + r_{01}r_{12}\exp(-i2\beta)}, \quad (6)$$

Where $\beta=2\pi dN_1 \cos\theta_1/\lambda$, $r_{ij,p}$ is a p-light reflectance on an interface between an $i^{th}$ layer and a $j^{th}$ layer, $r_{ij,s}$ is a s-light reflectance on the interface between the $i^{th}$ layer and the $j^{th}$ layer, and $r_{012}$ is a total reflectance.

In S4, a relational model of a Dill parameter of the photoresist and optical properties of the photoresist, and an exposure model of the photoresist are built. The optical properties include an extinction coefficient, an exposure light source wavelength, exposure light intensity, and a relative photoactive compound concentration of photoresist, and the Dill parameter includes a bleachable absorbance, a non-bleachable absorbance, and a reaction rate constant.

The Dill parameter of the photoresist and the relational model of the optical properties of the photoresist include:

$$\alpha = AM + B = 4\pi k/\lambda \quad (7)$$

$$\frac{\Delta M}{M} = \exp(-IC\Delta t), \quad (8)$$

where $\alpha$ is the absorption coefficient, M is the relative photoactive compound concentration at a specific position in the photoresist, k is the extinction coefficient, $\lambda$ is the exposure light source wavelength, I is the exposure light intensity at a corresponding position, A is a bleachable coefficient, B is a non-bleachable coefficient, C is the reaction rate constant, $\Delta M$ is a change in relative photoactive compound concentration, and $\Delta t$ is a change time.

Figure 5:
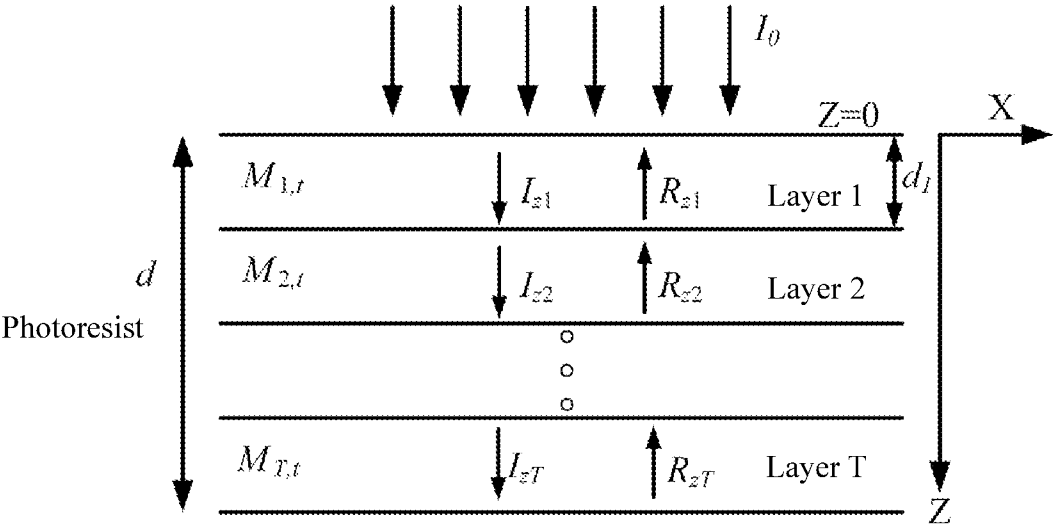
FIG. 5 is an exposure model built for the photoresist according to an embodiment of the disclosure.

The exposure model is to divide the photoresist into T-layer thin film stacks with a uniform thickness. Therefore, in the exposure model, the change law of the relative photoactive compound concentration inside the photoresist with exposure time and depth under the irradiation of specific light intensity can be described. As shown in FIG. 5, the total thickness of the photoresist is d, the photoresist is layered into a stack of T layers of thin films with uniform thickness. As T increases, the model accuracy is improved. Let T=500 and vertical incidence is treated as an example, the incident ultraviolet light intensity is set to I0, then the incident light intensity $I_j$ at the $j^{th}$ layer is:

$$I_j = I_{j-1}\exp(-\alpha(j)d(j)) = I_0\exp\left(-\sum_{i=1}^{j}(AM(i)+B)\,d(i)\right) \quad (9)$$

Further, the influence of the reflected light intensity at a photoresist/substrate interface needs to be taken into account. If a reflection coefficient of a bottom surface of the photoresist is Ref, then the reflected light intensity at the $j^{th}$ layer is:

$$R_j = I_T \times Ref \times \exp\left(-\sum_{i=T}^{j}(AM(i)+B)\,d(i)\right) \quad (10)$$

At t=0, the relative photoactive compound concentration M in the photoresist is 1. After the predetermined Dill parameters A and B are given, the total light intensity $$E_j = I_j + R_j$$

of the photoresist can be calculated by formulas (9) and (10), and the change $\Delta M$ of the relative photoactive compound concentration M after time dt can be calculated by formula (8), let t1=dt, then:

$$M(j, t_1) = M(j, t_0) - \Delta M(j, t_0) \quad (11)$$

An extinction coefficient $k_z$ at a depth z in the photoresist can be calculated from the exposure model, the Dill parameter of the photoresist, and the relational model of the optical properties of the photoresist. At t=0, the photoresist is not exposed, and the relative photoactive compound concentration in all internal positions is M=1. According to formula (7) at the depth z, the photoresist absorption coefficient is $\alpha(z)$, the incident light intensity herein is:

$$I(z) = I_0 \times \exp\left(-\int_0^z \alpha(z)\,dz\right)$$

To be specific, the relative photoactive compound concentration distribution after the time dt is calculated cyclically through formulas (8), (9), (10), and (11) until M at each layer is approximately 0. The extinction coefficient k(z,t) of the photoresist at different depths at different times may be calculated from formula (7) and I(z).

In S5, a relational model of a theoretical extinction coefficient and the extinction coefficient is built, and theoretical extinction coefficients of the photoresist after different exposure times are obtained.

The relational model of the theoretical extinction coefficient and the extinction coefficient is:

$$k_{mod} = \frac{1}{T}\int_0^T k_z dz,$$

where $k_{mod}$ is the theoretical extinction coefficient of the photoresist after exposure at different times, $k_z$ is the extinction coefficient, and T is the total number of layers of the photoresist film.

In S6, the average extinction coefficient and the theoretical extinction coefficient are inverted and fitted, and the Dill parameter is obtained.

A deviation function of the average extinction coefficient and the theoretical extinction coefficient is constructed, a Dill parameter initial value and the film thickness are inputted, the Dill parameter is fitted, and the Dill parameter by minimizing the deviation function is obtained.

The deviation function of the average extinction coefficient and the theoretical extinction coefficient is:

$$\text{Mse\_k} = \left(\sum_t (k_{mod}(t) - k_{ave}(t))^2\right)/Q,$$

where $k_{mod}(t)$ is the theoretical extinction coefficient at time t, $k_{ave}(t)$ is the average extinction coefficient at time t, and Q is the number of sampling points. Regarding the time interval of experimental sampling for exposure measurement, the time required for a single measurement by the ellipsometer and the power of the exposure light source shall be considered. The exposure light intensity may also be lowered to increase the number of sampling points in the exposure process to improve the fitting accuracy of the subsequent exposure process.

In another aspect, the disclosure further provides a quasi-dynamic in situ ellipsometry system for measuring a photoresist exposure process. The system includes a measure module, a first model building module, a calculation module, a second model building module, a third model building module, and a second calculation module.

The measure module is configured to measure Mueller matrix information of a photoresist before exposure by a Mueller matrix ellipsometer, expose and measure the photoresist by the Mueller matrix ellipsometer until Mueller matrix data remains unchanged, and obtain a measured Mueller matrix of the photoresist.

The first model building module is configured to treat the photoresist as a uniform film, build a forward optical model, and obtain a theoretical Mueller matrix.

The calculation module is configured to invert and fit the measured Mueller matrix and the theoretical Mueller matrix and obtain ellipsometric parameters of the photoresist at different times, an average extinction coefficient, and a film thickness.

The second model building module is configured to build a relational model of a Dill parameter of the photoresist and optical properties of the photoresist, and an exposure model of the photoresist. The optical properties include an extinction coefficient, an exposure light source wavelength, exposure light intensity, and a relative photoactive compound concentration of photoresist, and the Dill parameter includes a bleachable absorbance, a non-bleachable absorbance, and a reaction rate constant.

The third model building module is configured to build a relational model of a theoretical extinction coefficient and the extinction coefficient and obtain theoretical extinction coefficients of the photoresist after different exposure times.

The second calculation module is configured to invert and fit the average extinction coefficient and the theoretical extinction coefficient and obtain the Dill parameter.

A person having ordinary skill in the art should be able to easily understand that the above description is only preferred embodiments of the disclosure and is not intended to limit the disclosure. Any modifications, equivalent replacements, and modifications made without departing from the spirit and principles of the disclosure should fall within the protection scope of the disclosure.

What is claimed is:

1. A quasi-dynamic in situ ellipsometry method for measuring a photoresist exposure process, comprising:

S1: measuring Mueller matrix information of a photoresist before exposure by a Mueller matrix ellipsometer, exposing the photoresist and measuring the photoresist by the Mueller matrix ellipsometer until Mueller matrix data remains unchanged, and obtaining a measured Mueller matrix of the photoresist;

S2: treating the photoresist as a uniform film, building a forward optical model, and obtaining a theoretical Mueller matrix;

S3: inverting and fitting the measured Mueller matrix and the theoretical Mueller matrix and obtaining ellipsometric parameters, an average extinction coefficient, and a film thickness of the photoresist at different times;

S4: building a relational model of a Dill parameter of the photoresist and optical properties of the photoresist, and an exposure model of the photoresist, wherein the optical properties comprise an extinction coefficient, an exposure light source wavelength, exposure light intensity, and a relative photoactive compound concentration of photoresist, and the Dill parameter comprises a bleachable absorbance, a non-bleachable absorbance, and a reaction rate constant;

S5: building a relational model of a theoretical extinction coefficient and the extinction coefficient and obtaining theoretical extinction coefficients of the photoresist after different exposure times; and S6: inverting and fitting the average extinction coefficient and the theoretical extinction coefficient and obtaining the Dill parameter.

2. The method according to claim 1, wherein the relational model of the Dill parameter of the photoresist and the optical properties of the photoresist in step S4 comprise:

$$\alpha = AM + B = 4\pi k/\lambda$$

$$\frac{\Delta M}{M} = \exp(-IC\Delta t),$$

where α is an absorption coefficient, M is a relative photoactive compound concentration at a specific position in the photoresist, k is an extinction coefficient, λ is an exposure light source wavelength, I is an exposure light intensity at a corresponding position, A is a bleachable absorbance, B is a non-bleachable absorbance, C is the reaction rate constant, ΔM is a change in relative photoactive compound concentration, and Δt is a change time.

3. The method according to claim 1, wherein the exposure model is to divide the photoresist into a stack of T layers of thin films with uniform thickness.

4. The method according to claim 1, wherein the relational model of the theoretical extinction coefficient and the extinction coefficient in step S5 is:

$$k_{mod} = \frac{1}{T}\int_0^T k_z dz,$$

where $k_{mod}$ is the theoretical extinction coefficient, $k_z$ is the extinction coefficient, and T is a total thickness of a photoresist film.

5. The method according to claim 1, wherein the inverting and fitting the average extinction coefficient and the theoretical extinction coefficient in step S6 is:

constructing a deviation function of the average extinction coefficient and the theoretical extinction coefficient, inputting a Dill parameter initial value and the film thickness, fitting the Dill parameter, and obtaining the Dill parameter by minimizing the deviation function.

6. The method according to claim 5, wherein the deviation function of the average extinction coefficient and the theoretical extinction coefficient is:

$$\text{Mse\_k} = \left(\sum_t (k_{mod}(t) - k_{ave}(t))^2\right)/Q,$$

where $k_{mod}(t)$ is a theoretical extinction coefficient at time t, $k_{ave}(t)$ is an average extinction coefficient at time t, and Q is a number of sampling points.

7. The method according to claim 1, wherein the inverting and fitting the measured Mueller matrix and the theoretical Mueller matrix in step S3 is constructing a deviation function of the measured Mueller matrix and the theoretical Mueller matrix and solving the deviation function by minimizing the deviation function.

8. The method according to claim 7, wherein the deviation function of the measured Mueller matrix and the theoretical Mueller matrix is:

$$mse = \left(\sum_{\lambda} (M_{mod}(\lambda) - M_{exp}(\lambda))^2\right)/q$$

where $M_{mod}$ is the theoretical Mueller matrix, $M_{exp}$ is the measured Mueller matrix, A is a wavelength, and q is a number of wavelengths λ.

9. The method according to claim 2, wherein the exposure model is to divide the photoresist into a stack of T layers of thin films with uniform thickness.

10. The method according to claim 2, wherein the relational model of the theoretical extinction coefficient and the extinction coefficient in step S5 is:

$$k_{mod} = \frac{1}{T}\int_0^T k_z dz,$$

where $k_{mod}$ is the theoretical extinction coefficient, $k_z$ is the extinction coefficient, and T is a total thickness of a photoresist film.

11. The method according to claim 10, wherein the inverting and fitting the average extinction coefficient and the theoretical extinction coefficient in step S6 is:

constructing a deviation function of the average extinction coefficient and the theoretical extinction coefficient, inputting a Dill parameter initial value and the film thickness, fitting the Dill parameter, and obtaining the Dill parameter by minimizing the deviation function.

12. The method according to claim 11, wherein the deviation function of the average extinction coefficient and the theoretical extinction coefficient is:

$$\text{Mse\_k} = \left(\sum_t (k_{mod}(t) - k_{ave}(t))^2\right)/Q,$$

where $k_{mod}(t)$ is a theoretical extinction coefficient at time t, $k_{ave}(t)$ is an average extinction coefficient at time t, and Q is a number of sampling points.

13. A quasi-dynamic in situ ellipsometry system for measuring a photoresist exposure process, comprising:

a measure module: configured to measure Mueller matrix information of a photoresist before exposure by a Mueller matrix ellipsometer, expose the photoresist and measure the photoresist by the Mueller matrix ellipsometer until Mueller matrix data remains unchanged, and obtain a measured Mueller matrix of the photoresist;

a first model building module: configured to treat the photoresist as a uniform film, build a forward optical model, and obtain a theoretical Mueller matrix;

a calculation module: configured to invert and fit the measured Mueller matrix and the theoretical Mueller matrix and obtain ellipsometric parameters, an average extinction coefficient, and a film thickness of the photoresist at different times;

a second model building module: configured to build a relational model of a Dill parameter of the photoresist and optical properties of the photoresist, and an exposure model of the photoresist, wherein the optical properties comprise an extinction coefficient, an exposure light source wavelength, exposure light intensity, and a relative photoactive compound concentration of photoresist, and the Dill parameter comprises a bleachable absorbance, a non-bleachable absorbance, and a reaction rate constant;

a third model building module: configured to build a relational model of a theoretical extinction coefficient and the extinction coefficient and obtain theoretical extinction coefficients of the photoresist after different exposure times; and a second calculation module: configured to invert and fit the average extinction coefficient and the theoretical extinction coefficient and obtain the Dill parameter.

* * * * *